US008753903B1

(12) United States Patent
Tanner et al.

(10) Patent No.: US 8,753,903 B1
(45) Date of Patent: Jun. 17, 2014

(54) METHODS AND APPARATUSES FOR PERFORMING WAFER LEVEL CHARACTERIZATION OF A PLASMON ELEMENT

(75) Inventors: Shawn M. Tanner, San Jose, CA (US); Yufeng Hu, Fremont, CA (US); Sergei Sochava, Sunnyvale, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 91 days.

(21) Appl. No.: 13/478,058

(22) Filed: May 22, 2012

(51) Int. Cl.
*H01L 21/66* (2006.01)
(52) U.S. Cl.
USPC .................................................... 438/16
(58) Field of Classification Search
USPC .......................................................... 438/16
See application file for complete search history.

(56) References Cited

U.S. PATENT DOCUMENTS

| | | | |
|---|---|---|---|
| 7,034,277 B2 * | 4/2006 | Oumi et al. | 250/216 |
| 7,480,214 B2 | 1/2009 | Challener et al. | |
| 7,642,205 B2 * | 1/2010 | Timans | 438/795 |
| 7,710,686 B2 | 5/2010 | Kim et al. | |
| 7,724,470 B2 | 5/2010 | Poon et al. | |
| 8,085,459 B1 | 12/2011 | Russell et al. | |
| 8,111,443 B1 | 2/2012 | Russell et al. | |
| 8,200,054 B1 | 6/2012 | Li et al. | |
| 8,302,480 B2 * | 11/2012 | Maris et al. | 73/643 |
| 8,325,566 B2 | 12/2012 | Shimazawa et al. | |
| 8,339,905 B2 * | 12/2012 | Rausch et al. | 369/13.33 |
| 2002/0044285 A1 | 4/2002 | Pedersen et al. | |
| 2005/0122850 A1 | 6/2005 | Challener et al. | |
| 2006/0233061 A1 | 10/2006 | Rausch et al. | |
| 2007/0116420 A1 | 5/2007 | Estes et al. | |
| 2007/0165495 A1 | 7/2007 | Lee et al. | |
| 2008/0158730 A1 | 7/2008 | Furukawa et al. | |
| 2008/0204916 A1 | 8/2008 | Matsumoto et al. | |
| 2009/0165285 A1 | 7/2009 | Takayama et al. | |
| 2009/0185459 A1 | 7/2009 | Matsumoto | |
| 2010/0123900 A1 | 5/2010 | Chau et al. | |
| 2010/0214685 A1 | 8/2010 | Seigler et al. | |
| 2010/0315735 A1 | 12/2010 | Zhou et al. | |
| 2010/0316327 A1 | 12/2010 | Montoya et al. | |
| 2011/0122737 A1 | 5/2011 | Shimazawa et al. | |
| 2011/0216635 A1 | 9/2011 | Matsumoto | |
| 2012/0092971 A1 | 4/2012 | Schreck et al. | |
| 2012/0155232 A1 | 6/2012 | Schreck et al. | |
| 2012/0163137 A1 | 6/2012 | Wang et al. | |

OTHER PUBLICATIONS

Ikkawi, R., et al., "Near-Field Optical Transducer for Heat-Assisted Magnetic Recording for Beyond-10-Tbit/in2 Densities", Journal of Nanoelectronics and Optoelectronics, vol. 3, 44-54, 2008.
Chubing Peng, "Surface-plasmon resonance of a planar lollipop near-field transducer", Applied Physics Letters 94, 171106-1, Apr. 2009, 4 pages.

* cited by examiner

*Primary Examiner* — Luan C Thai

(57) ABSTRACT

Improved pump-probe testing methods and apparatuses for measuring the performance of a plasmon element at wafer level are provided. In one embodiment, the apparatus includes a light source configured to output a first light beam on a grating located at a first end of a waveguide, the waveguide being configured to couple energy of the first light beam to the plasmon element located at a second end of the waveguide, and an optical probe assembly positioned above a top surface of the wafer. The optical probe assembly is configured to direct a second light beam on an area of the wafer including the plasmon element and detect a portion of the second light beam reflected from the area.

28 Claims, 4 Drawing Sheets

METHODS AND APPARATUSES FOR PERFORMING WAFER LEVEL CHARACTERIZATION OF A PLASMON ELEMENT

FIELD

Aspects of the present invention relate to characterization of the performance of a plasmon element, and more particularly, methods and apparatuses for measuring the performance of a near-field transducer at wafer level.

BACKGROUND

In an energy-assisted magnetic recording (EAMR) system (e.g., hard disk), the minimum written bit size in the media is controlled by the minimum optical spot size produced by a near field transducer (NFT) acting as a plasmon element. In one design, the NFT has two portions, such as a disc and a pin, that serve different purposes. The disc converts electromagnetic energy of incident light into surface plasmons, and the pin channels a highly localized surface plasmon field to an air bearing surface (ABS). The performance of the NFT, both electric field intensity and spot size, depends on a number of NFT parameters such as core-NFT spacing, NFT-spacer interface, NFT size, NFT shape, NFT thickness, pin length, pin width, pin thickness, and NFT material. Additionally, the performance depends on the illumination conditions which are determined by the waveguide geometry (e.g., solid immersion mirror or channel waveguide) and grating coupler design.

In the related art, device characterization is generally performed at bar or slider level. However, bar or slider level testing is a time consuming and expensive process because it involves many backend processes (e.g., lapping process and other processes). Therefore, it is desirable to develop better methods and apparatuses to characterize the performance of the NFT such that the testing and development cycle can be reduced.

SUMMARY

Embodiments of the present invention are directed to improved pump-probe testing methods and apparatuses for measuring the performance of a plasmon element such as an NFT at wafer level. According to various embodiments, a pump-probe technique can be applied during a wafer manufacturing process to characterize the performance of the plasmon element. Therefore, the performance of the plasmon element can be evaluated earlier than that can be achieved in the related art.

According to an embodiment of the present invention, an apparatus for measuring performance of a plasmon element on a wafer is provided. The apparatus includes a light source configured to output a first light beam on a grating located at a first end of a waveguide, the waveguide being configured to couple energy of the first light beam to the plasmon element located at a second end of the waveguide, and an optical probe assembly positioned above a top surface of the wafer. The optical probe assembly is configured to direct a second light beam on an area of the wafer including the plasmon element and detect a portion of the second light beam reflected from the area.

According to another embodiment of the present invention, a method for measuring performance of a plasmon element on a wafer is provided. The method includes outputting from a light source a first light beam on a grating located at a first end of a waveguide, the waveguide being configured to couple energy of the first light beam to the plasmon element located at a second end of the waveguide, positioning an optical probe assembly above a top surface of the wafer, and operating the optical probe assembly to direct a second light beam on an area of the wafer including the plasmon element and detect a portion of the second light beam reflected from the area.

BRIEF DESCRIPTION OF THE DRAWINGS

The above and other features and aspects of the present invention will become more apparent by describing in detail embodiments thereof with reference to the attached drawings in which.

DETAILED DESCRIPTION

The present invention is directed to characterization of the performance of a near-field transducer (NFT) at wafer level using pump-probe techniques. The disclosed pump-probe testing apparatuses and methods enable testing of the NFT performance at wafer level. Accordingly, the time and expense of bar fabrication for testing the NFT in the related art can be reduced. In several embodiments of the present invention, wafer-level pump-probe testing during fabrication can provide earlier failure diagnostics, hence resulting in potential savings on unnecessary back end processing and slider fabrication. According to embodiments of the present invention, pump-probe testing apparatuses and methods are configured to allow top-down (wafer level) probing of the NFT. Therefore, the performance of the NFT can be characterized with respect to its composition and the geometrical factors at wafer level.

In order to perform top-down probing, an optical probe is situated above a wafer under test. As such, a pump laser beam will be incident on the wafer at a low angle due to the presence of an objective lens above the wafer. Therefore, the input grating on a waveguide is designed to couple the pump laser beam at a low angle to the wafer surface. In addition, the probe optics such as the objective lens is positioned further away from the wafer to make room for the pump laser beam.

Figure 1:
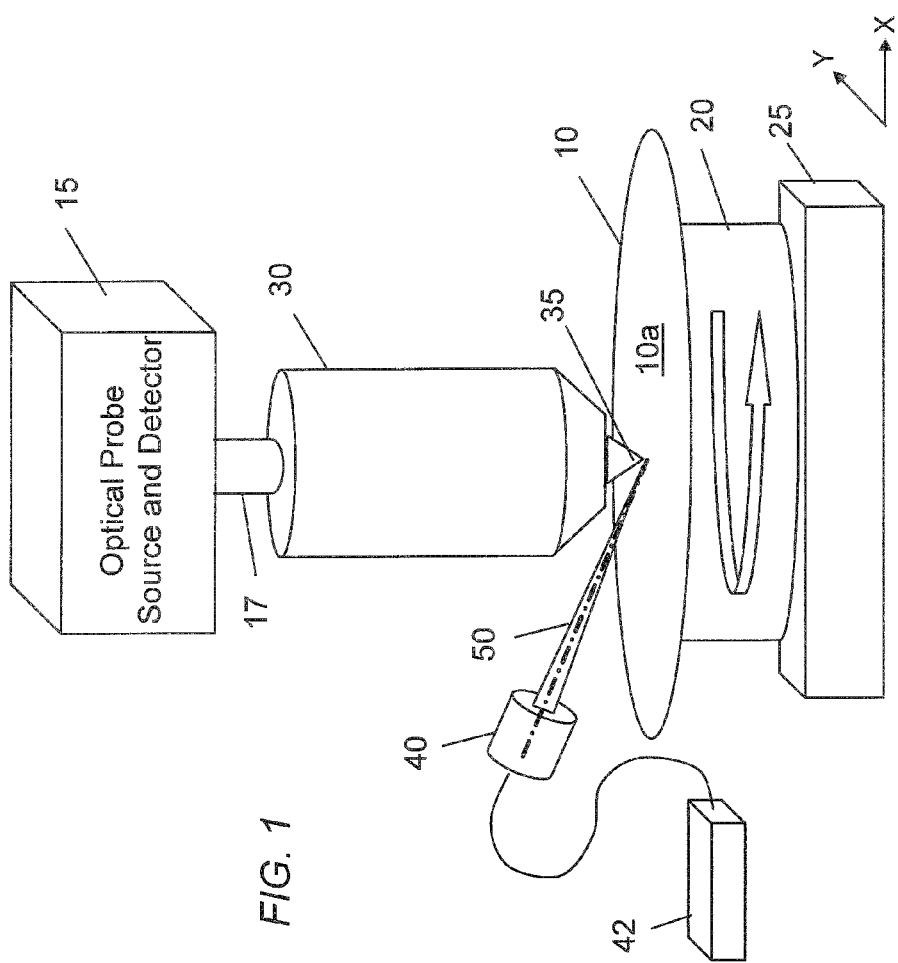
FIG. 1 is a perspective view illustrating a pump-probe testing apparatus for characterizing the performance of a plasmon element such as an NFT at wafer level including an objective lens for focusing a light beam on the wafer according to an embodiment of the present invention.

In several embodiments, a pump-probe technique is used to characterize the performance of an NFT (a plasmon element) at wafer level. FIG. 1 is a perspective view illustrating a pump-probe testing apparatus for characterizing the performance of a plasmon element such as an NFT at wafer level including an objective lens for focusing a light beam on the wafer according to an embodiment of the present invention. Referring to FIG. 1, a wafer 10 is secured on a platform 20 that can be configured to translate and/or rotate the wafer 10 during testing. An optical probe assembly includes an optical probe source/detector 15 and an objective lens 30. In one embodiment, the objective lens has a numerical aperture of about 0.7 and is located at a working distance of about 6 millimeters. The optical probe source/detector 15 is configured to output a probe beam 17 (e.g., a laser beam) to the objective lens 30 that is positioned above a top surface 10a of the wafer 10. The probe beam 17 is focused by the objective lens 30 thereby forming and directing a focused probe beam 35 on the top surface 10a. While the optical probe source/detector 15 is conceptually shown as a single block in FIG. 1, the optical probe source/detector 15 may instead be configured as separate components operatively coupled together according to various embodiments. For example, the optical probe source/detector 15 may include an optical source configured to output a probe laser incident on the wafer 10, and an optical detector configured to receive a beam reflected back from the wafer 10.

Referring to the embodiment of FIG. 1, a pump beam focuser (or optics) 40, which is coupled to a pump laser 42 by an optical fiber, is positioned at an angle to the top surface 10a of the wafer 10 to accommodate the presence of the objective lens 30 and focused probe beam 35. The objective lens 30 is spaced from the top surface 10a at a suitable preselected distance. In various embodiments, the objective lens 30 is spaced apart from the top surface 10a at a distance of about 1 mm and 10 mm, inclusive. In one embodiment, the objective lens 30 is spaced apart from the top surface 10a at a distance of about 6 mm. The pump beam focuser 40 is configured to output a pump beam 50 (e.g., a laser beam) on the surface 10a. The pump beam 50 is incident on the wafer 10 at a preselected angle with respect to the top surface 10a. In various embodiments, the angle between the pump beam 50 and the top surface 10a is between about 10 degrees and about 80 degrees, inclusive.

In several embodiments, the wafer 10 is placed on a chuck allowing translation in both X and Y directions. In the embodiment of FIG. 1, the platform 20 allows rotation of the wafer 10 such that the wafer 10 can be properly aligned with the probe beam 35 and the pump beam 50, and a translation stage 25 allows the wafer 10 to be moved in the X and Y directions.

During testing, the pump beam 50 can be tuned to various wavelengths, and the angle between the pump beam 50 and the wafer 10 is adjusted to a preselected angle to maximize coupling efficiency of the energy transferred from the pump beam 50 to the wafer 10. In several embodiments, the pump beam 50 is incident on a broadband grating on the wafer 10. During the testing, for each wavelength of the pump beam 50, the angle between the pump beam 50 and the wafer 10 is swept so that the point of maximum coupling efficiency and the corresponding angle can be determined. These actions can effectively form an optimization routine.

Figure 2:
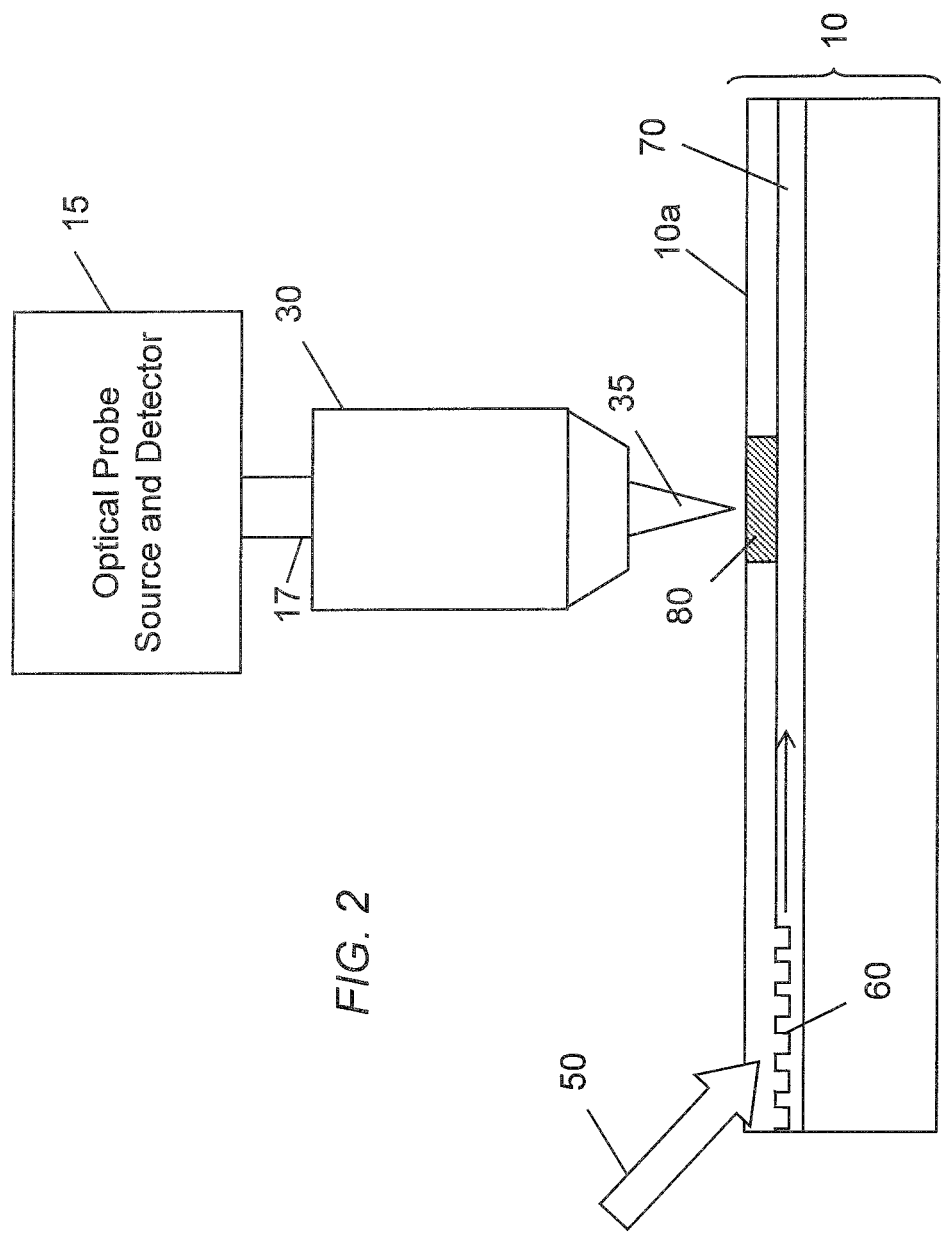
FIG. 2 is an expanded cross-sectional view of a portion of the wafer including the NFT of FIG. 1.

FIG. 2 is an expanded cross-sectional view of a portion of the wafer 10 of FIG. 1. The pump beam focuser 40 outputs the pump beam 50 on a grating 60 located at a first end of a waveguide 70. In various embodiments, a prism or other suitable structures can be used to couple the pump beam 50 to the waveguide 70. The waveguide 70 couples the energy of the pump beam 50 to an NFT region 80 located at a second end of the waveguide 70. In several embodiments, the waveguide 70 includes an upper cladding, a lower cladding, and a core located between the claddings. The refractive indexes of the claddings are lower than that of the core. The claddings may be made of a preselected material such as $Al_2O_3$, $SiO_2$, or other suitable materials. The core may be made of a preselected material such as $Ta_2O_5$, $Si_3N_4$, or other suitable materials. The NFT region 80 corresponds to a region on the wafer 10 where an NFT is fabricated. The NFT can be fabricated from a material including Al, Ag, Ag alloy, Au, Au alloy, TiN, or any other suitable plasmonic materials. As the energy of the pump beam 50 couples with the NFT region 80, surface plasmons in the NFT are excited.

At some time after the surface plasmons become excited, the focused probe beam 35 is directed on the NFT region 80, and a portion of the probe beam 35 is reflected by the surface 10a. Here, the focused probe beam 35 is substantially normal to the surface 10a. However, in other cases, the focused probe beam 35 is directed at a non-normal angle to the surface 10a. The probe beam 35 has a suitable wavelength to achieve reflection from the NFT region 80. In various embodiments, the probe beam 35 has a wavelength between about 300 nm and about 1000 nm, inclusive. The optical probe source/detector 15 is configured to detect the reflected portion of the probe beam 35. In one embodiment, the optical probe source/detector 15 is configured to detect changes in a local reflectivity of the NFT region 80. The change in reflectivity correlates to the temperature change at the NFT region 80 induced by the energy of the pump beam 50 coupled to the NFT region 80. In one embodiment, the change in reflectivity is proportional to the temperature change. The pump beam 50 is modulated at a first frequency (e.g., about 100 Hz to 100 KHz), and the optical probe source/detector 15 is configured to detect a variation of the reflected portion of the probe beam 35 at the first frequency. In various embodiments, the wavelength of the pump beam 50 is scanned, for example, between about 700 nm and about 1000 nm.

Figure 3:
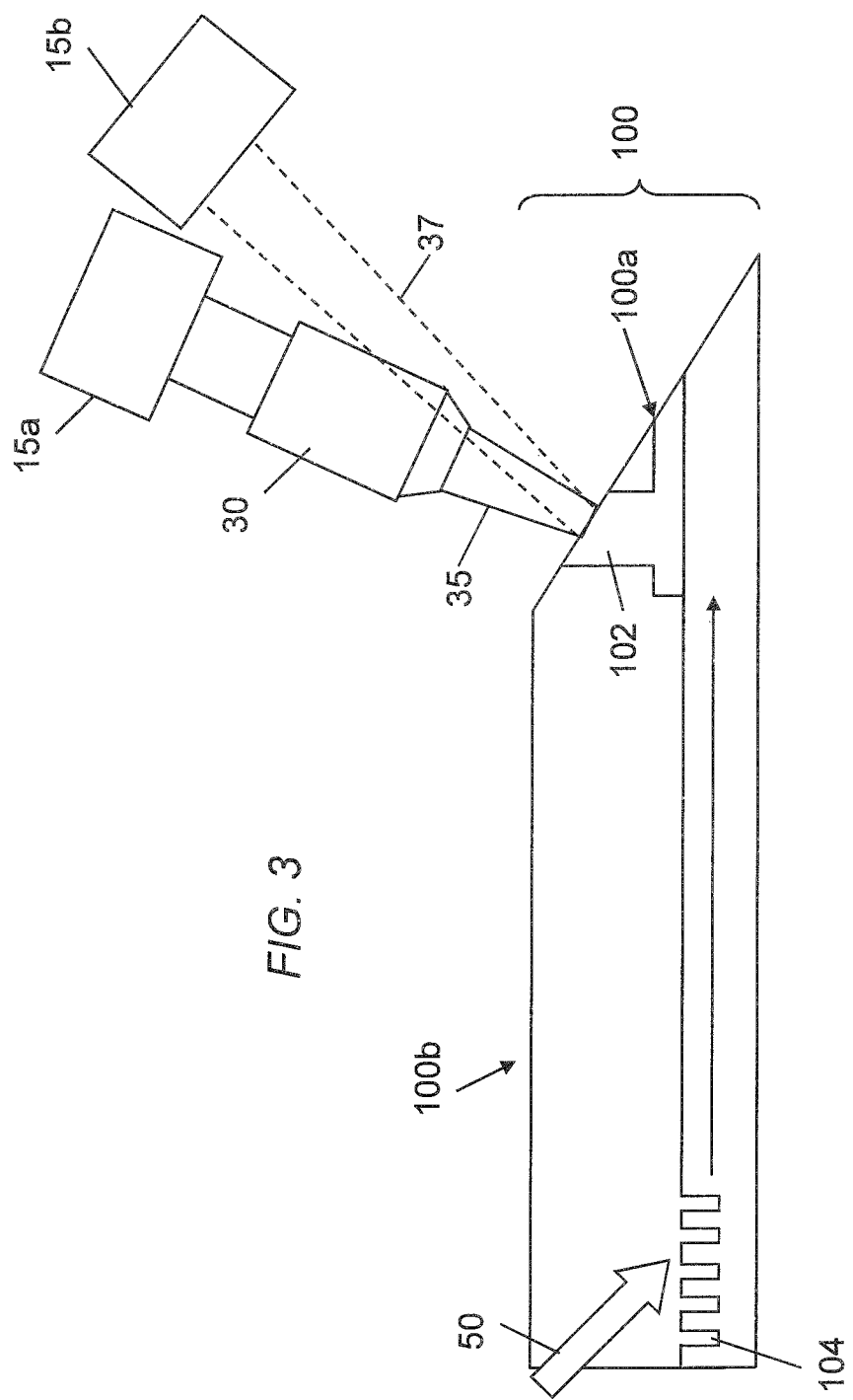
FIG. 3 is an expanded cross-sectional view of a portion of a wafer including an NFT along a fabricated surface and an apparatus for characterizing the performance of the NFT according to another embodiment of the present invention.

FIG. 3 is a cross-sectional view of a portion of a wafer 100 including an NFT 102 along a fabricated surface 100a and an apparatus for characterizing the performance of the NFT 102 according to another embodiment of the present invention. In the embodiment of FIG. 3, the focused probe beam 35 is directed by an optical probe source 15a such that it is incident on the fabricated surface 100a (e.g., a beveled surface) at a suitable preselected angle, and a reflected beam 37 is reflected from the surface 100a toward an optical probe detector 15b. In other embodiments, the probe beam 35 is substantially normal to the fabricated surface 100a, and therefore the reflected beam 37 is substantially normal to the fabricated surface 100a. (See e.g., FIG. 2 where the optical probe source/detector is one component).

The fabricated surface 100a is at an angle (e.g., about 20 degrees to about 50 degrees) with respect to a top surface 100b of the wafer 100. Therefore, the probe beam 35 is generally not normal to the top surface 100b of the wafer 100 as compared to the probe beam 35 in FIG. 2. This configuration broadens the range of angles accessible to the pump beam 50 allowing for a larger range of wavelength scanning. In addition, an NFT 102 is exposed at the fabricated surface 100a, improving signal-to-noise ratio of the measurement of the NFT 102 during testing at wafer level. The energy of the pump beam 50 is coupled to the NFT 102 via a grating 104 to excite surface plasmons. Similar to the embodiment of FIG. 2, the pump beam 50 is modulated at a first frequency, and the optical probe source 15a and optical probe detector 15b are configured to detect a variation of the reflected portion of the probe beam 35 at the first frequency. The optical probe source/detector 15 includes a suitable detector (not shown) configured to detect changes in a local reflectivity of the NFT 102. The change in the reflectivity correlates to the NFT temperature change induced by the energy of the pump beam 50 coupled to the NFT 102.

In the above described drawings, the shapes and dimensions of the probe beam 35 and various features including the wafers (10 and 100) are conceptually illustrated and not drawn to scale for clarity. In various practical embodiments, the features of the wafers and the components of the present invention may have other suitable shapes and dimensions. For example, the size of the probe beam 35 focused on the wafers may be larger than the NFT region 80 and/or the exposed portion of the NFT 102 in practical embodiments.

Referring to FIGS. 1-3, at least a portion of the energy of the pump beam 35 is transferred to the NFT region 80 or the NFT 102. The transferred energy causes the NFT region 80/NFT 102 to heat up. The extent of heating correlates to (e.g., approximately proportional) the coupling efficiency from the waveguide to the NFT region 80/NFT 102. Therefore, the coupling efficiency of the NFT region 80/NFT 102 can be determined by measuring the temperature change of the NFT region 80/NFT 102 using the portion of the probe beam 50 reflected back to the optical probe source/detector 15. Accordingly, the performance of the NFT region 80/NFT 102 can be characterized at the wafer level.

Figure 4:
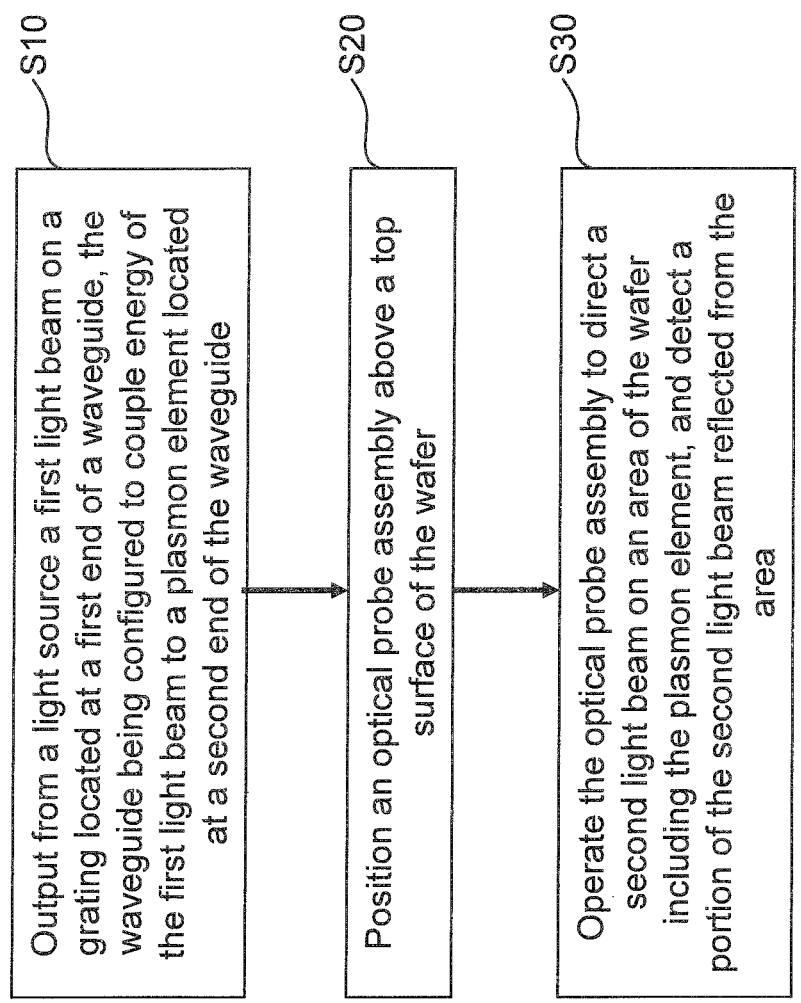
FIG. 4 is a flowchart illustrating a method for measuring the performance of a plasmon element such as an NFT at wafer level according to an embodiment of the present invention.

FIG. 4 is a flowchart illustrating a method for measuring the performance of a plasmon element (e.g., an NFT) at wafer level according to an embodiment of the present invention. In block S10, a light source outputs a light beam on a grating located at a first end of a waveguide. Here, the waveguide is configured to couple the energy of the first light beam to the plasmon element located at a second end of the waveguide. In several embodiments, the first light beam is modulated at a first frequency. In block S20, an optical probe assembly is positioned above a top surface of the wafer. In block S30, the optical probe assembly is operated to direct a second light beam on an area of the wafer including the plasmon element, and detect a portion of the second light beam reflected from the area. In several embodiments, the optical probe assembly is configured to detect a variation of the portion of the second light beam at the first frequency.

In the above described embodiments, the process or method can perform the sequence of actions in a different order. In another embodiment, the process or method can skip one or more of the actions. In other embodiments, one or more of the actions are performed simultaneously or concurrently. In some embodiments, additional actions can be performed.

According to various embodiments of the present invention, a coupling efficiency of the plasmon element can be determined at wafer level by detecting the amount of energy of the first light beam transferred to the plasmon element. Therefore, the coupling efficiency of the plasmon element can be measured before dicing the wafer. Furthermore, the manufacturing process of the wafer can be modified based on the measurement of the coupling efficiency, resulting in potential process improvement.

In one embodiment, an apparatus is provided for measuring the performance of a plasmon element on a wafer. The apparatus includes a light source configured to output a first light beam (e.g., a pump laser) on a grating located at a first end of a waveguide, and the waveguide is configured to couple energy of the first light beam to the plasmon element located at a second end of the waveguide. The apparatus also includes an optical probe assembly positioned above a top surface of the wafer. The optical probe assembly is configured to direct a second light beam (e.g., a probe laser) on an area of the wafer including the plasmon element and detect a portion of the second light beam reflected from the area. The optical probe assembly can include separate components for outputting the second light beam and detecting a reflected light beam, respectively.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An apparatus for measuring performance of a plasmon element on a wafer, the apparatus comprising:
   a light source configured to output a first light beam on a grating located at a first end of a waveguide, the waveguide being configured to couple energy of the first light beam to the plasmon element located at a second end of the waveguide; and
   an optical probe assembly positioned above a top surface of the wafer and configured to:
      direct a second light beam on an area of the wafer including the plasmon element; and
      detect a portion of the second light beam reflected from the area.

2. The apparatus of claim 1, wherein the detected portion is used to determine a coupling efficiency of the plasmon element, and the coupling efficiency corresponds to an amount of the energy of the first light beam transferred to the plasmon element.

3. The apparatus of claim 1, wherein the first light beam has a wavelength between about 700 nm and about 1000 nm, inclusive.

4. The apparatus of claim 1, wherein the first light beam is modulated at a first frequency, and the optical probe assembly is configured to detect a variation of the portion of the second light at the first frequency.

5. The apparatus of claim 1, wherein the optical probe assembly is configured to detect a change in reflectivity of the area induced by the energy of the first light beam coupled to the plasmon element.

6. The apparatus of claim 5, wherein the change in the reflectivity of the area correlates to a temperature change of the plasmon element.

7. The apparatus of claim 1, wherein the optical probe assembly is configured to output the second light beam incident upon a surface of the area at an angle substantially normal to the surface.

8. The apparatus of claim 1, wherein the area including the plasmon element is a fabricated surface at an angle with respect to the top surface of the wafer, and the plasmon element is exposed at the fabricated surface.

9. The apparatus of claim 1, wherein the plasmon element comprises a near-field transducer.

10. The apparatus of claim 1, wherein the optical probe assembly comprises an objective lens spaced apart from the area at a distance of about 1 mm to about 10 mm, inclusive.

11. The apparatus of claim 10, wherein the objective lens is spaced apart from the area at about 6 mm.

12. The apparatus of claim 1, wherein the first light beam is incident on the grating at an angle with respect to the top surface of the wafer between about 10 degrees and about 80 degrees, inclusive.

13. A method for measuring performance of a plasmon element on a wafer, the method comprising:
   outputting from a light source a first light beam on a grating located at a first end of a waveguide, the waveguide being configured to couple energy of the first light beam to the plasmon element located at a second end of the waveguide;
   positioning an optical probe assembly above a top surface of the wafer; and
   operating the optical probe assembly to:

direct a second light beam on an area of the wafer including the plasmon element; and detect a portion of the second light beam reflected from the area.

14. The method of claim 13, further comprising determining a coupling efficiency of the plasmon element using the detected portion, wherein the coupling efficiency corresponds to an amount of the energy of the first light beam transferred to the plasmon element.

15. The method of claim 14, wherein the coupling efficiency of the energy of the first light beam coupled to the plasmon element is measured before dicing the wafer.

16. The method of claim 15, wherein the wafer was formed using a preselected manufacturing process, the method further comprising modifying the preselected manufacturing process for a subsequent wafer based on a result of the measured coupling efficiency.

17. The method of claim 13, wherein the first light beam has a wavelength between about 700 nm and about 1000 nm, inclusive.

18. The method of claim 13, wherein the first light beam is modulated at a first frequency, and wherein the operating the optical probe assembly further comprises detecting a variation of the portion of the second light beam at the first frequency.

19. The method of claim 13, wherein the operating the optical probe assembly further comprises detecting a change in reflectivity of the area induced by the energy of the first light beam coupled to the plasmon element.

20. The method of claim 19, wherein the change in the reflectivity of the area correlates to a temperature change of the plasmon element.

21. The method of claim 13, wherein the operating the optical probe assembly further comprises outputting the second light beam incident upon a surface of the area at an angle substantially normal to the surface.

22. The method of claim 13, wherein the area including the plasmon element is a fabricated surface at an angle with respect to the top surface of the wafer, and the plasmon element is exposed at the fabricated surface.

23. The method of claim 13, wherein the plasmon element comprises a near-field transducer.

24. The method of claim 13, wherein the optical probe assembly comprises an objective lens spaced apart from the area at a distance of about 1 mm to about 10 mm, inclusive.

25. The method of claim 24, wherein the objective lens is spaced apart from the area at about 6 mm.

26. The method of claim 13, wherein the first light beam is incident on the grating at an angle with respect to the top surface of the wafer between about 10 degrees and about 80 degrees, inclusive.

27. The method of claim 13, wherein the coupling efficiency of the energy of the first light beam coupled to the plasmon element is measured before dicing the wafer.

28. The method of claim 13, wherein the wafer was formed using a preselected manufacturing process, the method further comprising modifying the preselected manufacturing process for a subsequent wafer based on a result of the measured coupling efficiency.

* * * * *